(12) United States Patent
Lu

(10) Patent No.: US 9,187,621 B2
(45) Date of Patent: Nov. 17, 2015

(54) REFLECTOR FOR LIGHT-EMITTING DEVICES

(75) Inventor: Bing Lu, Union, KY (US)

(73) Assignee: Ticona LLC, Florence, KY (US)

( * ) Notice: Subject to any disclaimer, the term of this patent is extended or adjusted under 35 U.S.C. 154(b) by 0 days.

(21) Appl. No.: 14/360,016

(22) PCT Filed: Apr. 5, 2012

(86) PCT No.: PCT/US2012/032269
§ 371 (c)(1),
(2), (4) Date: Jun. 19, 2014

(87) PCT Pub. No.: WO2013/101277
PCT Pub. Date: Jul. 4, 2013

(65) Prior Publication Data
US 2014/0299907 A1     Oct. 9, 2014

Related U.S. Application Data

(60) Provisional application No. 61/581,812, filed on Dec. 30, 2011.

(51) Int. Cl.
*C08K 5/5333* (2006.01)
*C08K 5/5317* (2006.01)
*H01L 33/60* (2010.01)

(52) U.S. Cl.
CPC ............. *C08K 5/5333* (2013.01); *C08K 5/5317* (2013.01); *H01L 33/60* (2013.01); *H01L 2224/48091* (2013.01); *H01L 2224/48247* (2013.01)

(58) Field of Classification Search
CPC .................................................. C08K 5/5333
USPC ........................................................ 524/128
See application file for complete search history.

(56) References Cited

U.S. PATENT DOCUMENTS

| | | | |
|---|---|---|---|
| 4,111,892 A | 9/1978 | Kamada et al. | |
| 4,608,623 A | 8/1986 | Stephano | |
| 4,753,890 A | 6/1988 | Smith-Lewis et al. | |
| 4,753,980 A | 6/1988 | Deyrup | |
| 4,859,732 A | 8/1989 | Minnick | |
| 4,999,055 A | 3/1991 | Holtzen et al. | |
| 5,015,942 A | 5/1991 | Kolanko | |
| 5,207,967 A | 5/1993 | Small, Jr. et al. | |
| 5,254,288 A * | 10/1993 | Verheijen et al. | 252/519.21 |
| 5,256,787 A | 10/1993 | Borzatta et al. | |
| 5,428,086 A | 6/1995 | Minnick et al. | |
| 5,596,049 A | 1/1997 | Gallucci et al. | |
| 5,707,437 A | 1/1998 | Niedenzu et al. | |
| 5,965,261 A | 10/1999 | Webster | |
| 6,093,765 A | 7/2000 | Cottis | |
| 6,197,873 B1 | 3/2001 | Miyata et al. | |
| 6,236,061 B1 | 5/2001 | Walpita | |
| 6,707,437 B1 | 3/2004 | Kuno | |
| 6,878,972 B2 | 4/2005 | Waalib-Singh et al. | |
| 7,381,996 B2 | 6/2008 | Hsin Chen | |
| 7,709,568 B2 | 5/2010 | Bersted et al. | |
| 7,999,280 B2 | 8/2011 | Kim et al. | |
| 8,007,885 B2 | 8/2011 | Topoulos | |
| 8,013,057 B2 | 9/2011 | Taguchi et al. | |
| 8,070,316 B2 | 12/2011 | Urano et al. | |
| 8,288,793 B2 | 10/2012 | Kim et al. | |
| 8,480,254 B2 | 7/2013 | Lu | |
| 8,545,718 B2 | 10/2013 | Nakayama et al. | |
| 2001/0007888 A1 * | 7/2001 | Asano | 524/115 |
| 2003/0065106 A1 | 4/2003 | Ambrose | |
| 2003/0096122 A1 | 5/2003 | Mercx et al. | |
| 2003/0109629 A1 | 6/2003 | Pierre et al. | |
| 2003/0178221 A1 | 9/2003 | Chiu et al. | |
| 2004/0156213 A1 | 8/2004 | Lodhie | |
| 2005/0007772 A1 | 1/2005 | Yen | |
| 2005/0043483 A1 | 2/2005 | Kim et al. | |
| 2005/0118393 A1 | 6/2005 | Corcoran et al. | |
| 2005/0176835 A1 | 8/2005 | Kobayashi et al. | |
| 2006/0230553 A1 | 10/2006 | Thullen et al. | |
| 2007/0012931 A1 * | 1/2007 | Lee et al. | 257/89 |
| 2007/0155913 A1 | 7/2007 | Chakravarti et al. | |
| 2007/0213458 A1 * | 9/2007 | Topoulos | 524/601 |
| 2009/0014505 A1 | 1/2009 | Cretegny et al. | |
| 2009/0141505 A1 | 6/2009 | Ushiki et al. | |
| 2009/0277858 A1 | 11/2009 | Mitadera et al. | |
| 2010/0032702 A1 | 2/2010 | Lahijani | |
| 2010/0200882 A1 | 8/2010 | Kotani et al. | |
| 2010/0309571 A1 | 12/2010 | Watari et al. | |
| 2011/0189453 A1 | 8/2011 | Leemans et al. | |
| 2011/0310622 A1 | 12/2011 | Topoulos | |
| 2012/0097894 A1 | 4/2012 | Nakayama et al. | |
| 2012/0262927 A1 | 10/2012 | Lu | |
| 2012/0264868 A1 | 10/2012 | Lu | |
| 2013/0158184 A1 | 6/2013 | Topoulos | |
| 2014/0167088 A1 | 6/2014 | Lu | |

FOREIGN PATENT DOCUMENTS

| | | |
|---|---|---|
| CN | 101565538 A | 10/2009 |
| EP | 0273149 | 6/1988 |

(Continued)

OTHER PUBLICATIONS

International Search Report for Application No. PCT/US2012/032269, dated Jun. 28, 2012.

(Continued)

*Primary Examiner* — Doris Lee
(74) *Attorney, Agent, or Firm* — Dority & Manning, P.A.

(57) ABSTRACT

Polymer compositions are described that are well suited for producing reflectors for light-emitting devices, such as light-emitting diodes. In one embodiment, the polymer composition contains a polymer resin and a stabilizer comprising a phosphonate compound and/or a phosphate compound and optionally a white pigment. The polymer resin may comprise, for instance, a poly(1,4-cyclohexanedimethanol terephthalate). The phosphate stabilizer has been found to significantly improve the stability of the polymer composition without interfering with the ability of the composition to bond to other polymer materials, such as silicone resins. Silicone resins, for instance, are typically used as an encapsulant for light-emitting diode assemblies.

21 Claims, 2 Drawing Sheets

(56) References Cited

FOREIGN PATENT DOCUMENTS

| | | |
|---|---|---|
| EP | 0485240 A1 | 5/1992 |
| EP | 0 684 648 A2 | 11/1995 |
| EP | 1798268 | 6/2007 |
| JP | 55027335 A | 2/1980 |
| JP | 03084060 | 9/1991 |
| JP | 04142362 | 5/1992 |
| JP | H06151977 | 5/1994 |
| JP | 11087780 A | 3/1999 |
| JP | 2002302596 A | 10/2002 |
| JP | 2003124521 | 4/2003 |
| JP | 2003262701 A | 9/2003 |
| JP | 2005038661 A | 2/2005 |
| WO | WO 02/052615 A2 | 7/2002 |
| WO | WO 03/085029 A1 | 10/2003 |
| WO | WO 2008/002362 A1 | 1/2008 |
| WO | WO 2010000838 | 1/2010 |
| WO | WO 2010/049531 A1 | 5/2010 |
| WO | WO 2011/040138 A1 | 7/2011 |
| WO | WO 2012/141967 A1 | 10/2012 |
| WO | WO 2013/101277 A1 | 4/2013 |

OTHER PUBLICATIONS

DuPont Ti-Pure®; "Titanium Dioxide for Coatings"; Jun. 2007; pp. 1-28.

IARC Working Group on the Evaluation of Carcinogenic Risks to Humans: "Titanium Dioxide" in IARC Monographs on the Evaluation of Carcinogenic Risks to Humans, Carbon Black, Titanium Dioxide and Talc. IARC Monographs, vol. 93, 2010; pp. 193-214.

Temple C. Patton, "Pigment Handbook, vol. II, Applications and markets"; John Wiley & Sons; dated 1973.

* cited by examiner

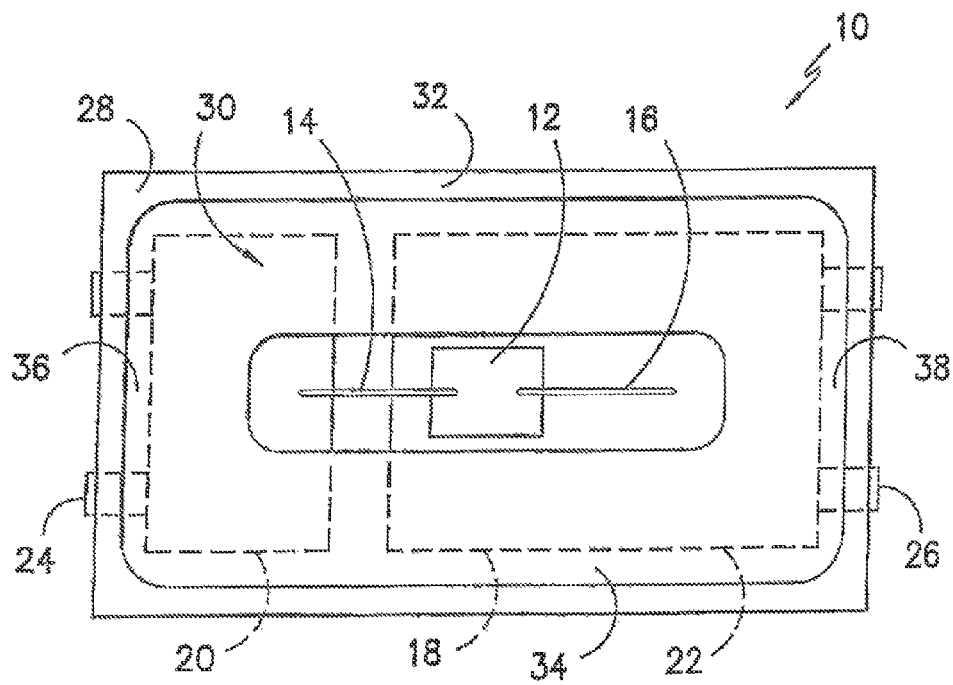
FIG. -1-
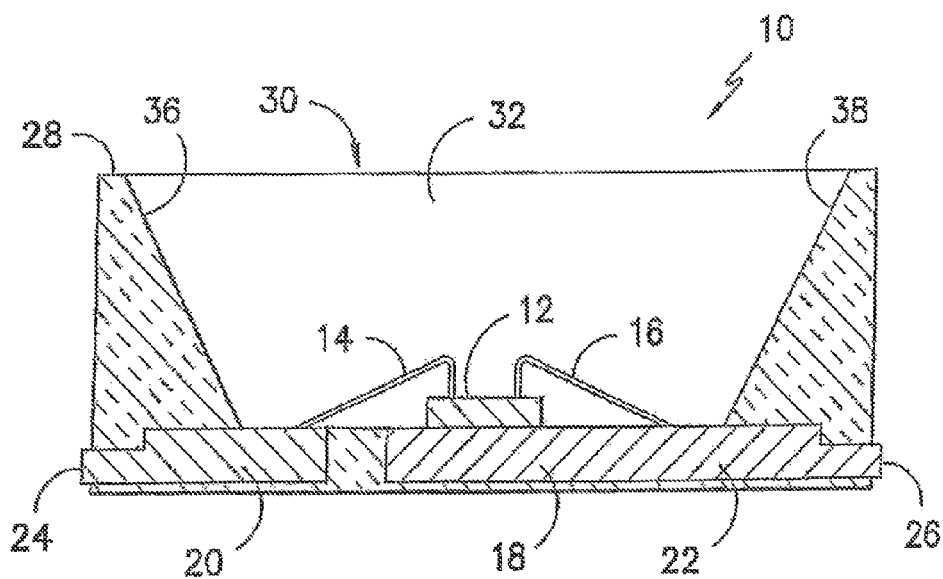
FIG. -2-

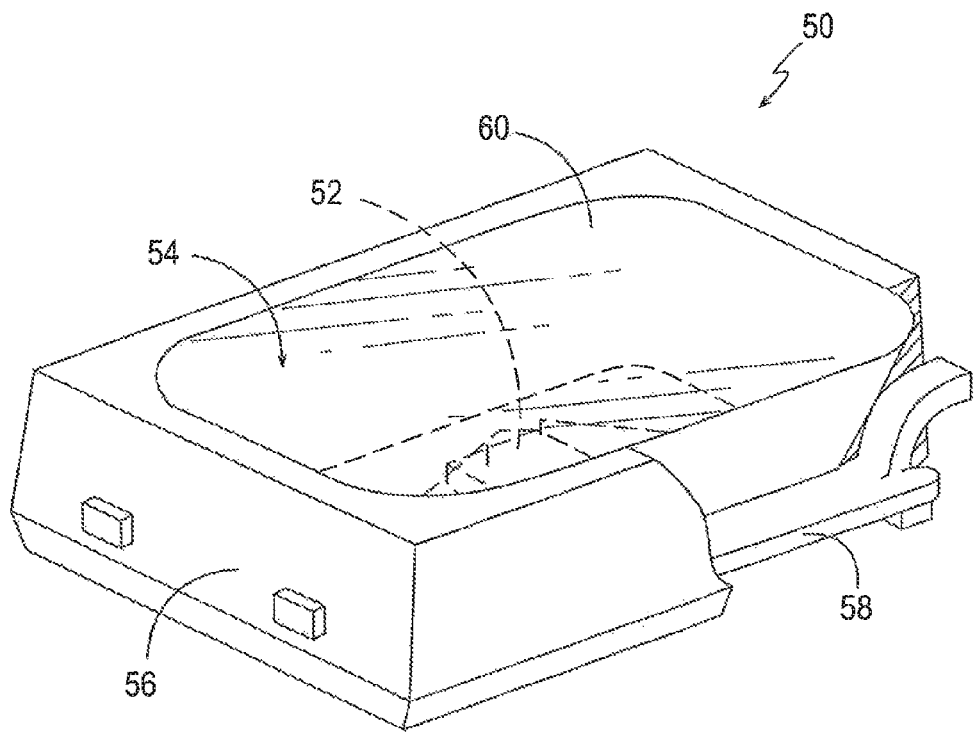
FIG. -3-
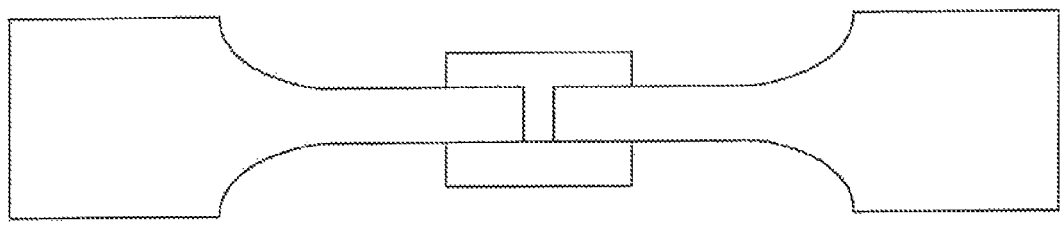
FIG. -4-

REFLECTOR FOR LIGHT-EMITTING DEVICES

RELATED APPLICATIONS

This present application claims priority to PCT International Patent Application No, PCT/US2012/032269 having a filing date of Apr. 5, 2012, and which claims filing benefit to U.S. Patent Application No. 61/581,812 filed on Dec. 30, 2011, which are all hereby incorporated by reference in their entirety.

BACKGROUND

Light-emitting diodes, commonly called LEDs, continue to increase in popularity as a light source for use in many and diverse applications. The demand for LEDs has grown rapidly, especially in the last five years. LEDs are being used as light sources in numerous applications due to their many advantages over conventional light sources. LEDs generally consume significantly less power than incandescent and other light sources, require a low voltage to operate, are resistant to mechanical shock, require low maintenance, and generate minimal heat when operating. As a result, LEDs are displacing incandescent and other light sources in many uses and have found applications, for instance, as traffic signals, large area displays, interior and exterior lighting, cellular telephone displays, digital clock displays, displays for consumer appliances, flashlights, and the like.

LEDs generally include a light-emitting diode mounted on a substrate that is electrically connected to a lead frame. The lead frame typically includes two terminals for connecting the LED to a power source. The light-emitting diode is a semiconductor device fabricated similar to the manner in which integrated circuits are produced. For instance, the light-emitting diode can be made from several layers of material that are sequentially deposited on a semiconductor substrate. The light-emitting diode within the semiconductor material includes an n-type material separated from a p-type material by an active layer. When a voltage is applied to the diode, positive charges or "holes" from the p-type material move towards the active layer while the negative charges or electrons from the n-type material also move towards the active layer in an opposite direction which produces light. In particular, the moving electrons release energy in the form of photons. Thus, one significant advantage of LEDs is that the devices produce light without a filament that will burn out over time. Thus, LEDs last a relatively long time, can be made to be very compact, and are very durable. Further, since a filament is not heated in order to produce light, LEDs are also very energy efficient.

After a light-emitting diode is fabricated, the semiconductor chip can be mounted adjacent to a reflector and connected to a lead frame. The lead frame can include an anode terminal and a cathode terminal for applying power to the assembly. In certain embodiments, the LED element located within the reflector can be sealed by a translucent or transparent resin, which is typically a silicone resin. The transparent or translucent resin may serve as a lens for further enhancing the light that is emitted.

The reflector for the LED can also serve as the housing for the LED and is typically made from a molded polymeric resin. For example, the polymeric resin can be injection molded to form the housing and reflector. In one embodiment, the polymeric resin is injection molded over a lead frame for integrating the lead frame into the LED assembly.

The molded polymer resin used to form the reflector preferably possesses a particular combination of characteristics and properties. For instance, the polymer resin should be well suited to reflecting light at the wavelength at which the LED operates. Many LEDs, for instance, are designed to emit a white light. Thus, the polymer resin used to form the reflector should reflect a significant amount of light in the visible light region and particularly should reflect a significant percentage of light in the blue light wavelength range. Reflecting light in the blue wavelength range, for instance, has been found to significantly enhance the brightness of the LED, since white light emitted by an LED contains a significant amount of light in the blue wavelength range. Increasing the reflectance of the reflector as high as possible minimizes loss of light when the LED is being operated.

The polymer resin used to form the reflector should also possess a high whiteness index. The whiteness index of the reflector indicates how well the reflector can reflect light over the entire visible light wavelength range (from about 400 nm to about 700 nm). In general, the higher the whiteness index of the material, the higher the reflectance of the material. A material possessing a white index value of 100, for instance, is considered a substantially perfect reflecting diffuser.

In addition to having excellent reflectance properties, the polymer resin used to form the reflector should also have good melt flow properties during injection molding of the parts. For instance, many LED structures are relatively small having dimensions that at times can be less than 1 millimeter. Reflectors can also have relatively complex shapes depending upon the particular application and the geometries of the lead plate in the LED. Thus, when the polymer resin is heated, the polymer should have sufficient flow properties in order to uniformly and repeatedly fill the interstices of the mold. The polymer resin should also have a stable viscosity that does not fluctuate during processing.

In addition to the above, the polymer resin used to form the reflector should have sufficient heat resistance including long term aging stability when either being soldered onto an adjacent part or when exposed to the operating temperatures of the LED. Many LED assemblies, for instance, are attached to circuit boards and other substrates using reflow oven welding processes that operate at temperatures up to about 260° C. The polymer resin should have good heat resistance properties to the reflow process and should not blister or otherwise deteriorate when subjected to the welding conditions.

During use, the LED also generates heat which is absorbed by the reflector. In the past few years, the amount of heat generated by the LED has increased as the LED element power has increased. When subjected to heat during welding and/or heat during use, the reflectance properties of the polymer resin should not deteriorate. In the past, for instance, exposure to high temperatures and/or repeated heating and cooling during use have caused polymer resins to yellow. Yellowing causes the whiteness index of the resin to lower. Yellowing is especially a problem for LEDs that emit blue light since yellow surfaces have a tendency to absorb light in the blue wavelength range. In addition to the above, the reflector is generally a thin small part and requires satisfactory mechanical strength. Thus, reflectors should also have sufficient impact strength to avoid breakage during assembly of the LED and during use of the LED.

Reflectors and housings for light sources, such as LEDs, should also have good adhesion to the encapsulant for the device, which can be a translucent or transparent resin. In many applications, for instance, the encapsulant comprises a silicone. The encapsulant serves to integrate all of the parts of the device together and is intended to prevent moisture penetration into the device. Moisture, for instance, can corrode different parts of a light-emitting diode, such as the lead frame and any wires connected to the lead frame. Thus, the penetration of moisture into the device can ultimately lead to failure. Consequently, another property which may be important is the ability of the reflector to bond or adhere to the encapsulant.

In the past, additives were added to the reflector in order to improve one or more properties. For example, various stabilizers have been added to the polymer composition used to form the reflector. The stabilizers were added to the composition in order to improve light stability. Unfortunately, however, adding an additive to the polymer composition in order to improve one property may adversely interfere with another property of the reflector. For instance, incorporating stabilizers into the polymer composition may adversely interfere with the ability of the reflector to adhere to the encapsulant.

In U.S. Patent Publication No. 2007/0213458 entitled "Light-Emitting Diode Assembly Housing Comprising Poly (cyclohexanedimethanol terephthalate) Compositions", a reflector for an LED is disclosed that is made from a poly (cyclohexanedimethanol terephthalate) (hereinafter "PCT") composition. The '458 application, which is incorporated herein by reference, has made great advances in the design and function of LEDs. The present disclosure is directed to further improvements.

SUMMARY

In general, the present disclosure is directed to a molded reflector for a light source, such as a light-emitting diode. The present disclosure is also directed to a polymer composition for producing the reflector.

As will be described in greater detail below, the polymer composition of the present disclosure can be formulated so as to have not only high reflectance properties, but also good adhesion properties to encapsulating materials, such as silicones, while also containing various stabilizers. In particular, it was discovered that various stabilizers used to make reflectors may adversely interfere with the ability of the composition to adhere and bond to silicone materials, which are typically used as encapsulants. The present disclosure overcomes the above disadvantages.

In one embodiment, for instance, the present disclosure is directed to a molded reflector surrounding a light-emitting source. The reflector is molded from a polymeric material. The polymeric material is comprised of poly(1,4-cyclohexanedimethanol terephthalate), a white pigment, and an antioxidant stabilizer that comprises a phosphorus compound, such as an organophosphorus compound, in which at least one phosphorus has a +5 valence state and/or comprises a phosphonate and/or phosphate. The phosphonate and phosphate have been found to stabilize at least one property of the polymer composition without adversely impacting upon the ability of the composition to bond and adhere to encapsulants and other resins, particularly silicone resins. As used herein, phosphonate compounds and/or phosphate compounds include diphosphonates, disphosphates, and the like.

In one embodiment, the phosphonate stabilizer has the following formula:

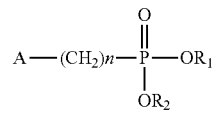

Wherein $R_1$ is H, C1-C20 alkyl, unsubstituted or C1-C4 alkyl-substituted phenyl or naphthyl;

$R_2$ is H, C1-C20 alkyl, unsubstituted or C1-C4 alkyl-substituted phenyl or naphthyl, or $M^{r+}_r$ wherein $M^{r+}$ is an r-valent metal cation or ammonium ion;

n is an integer from 0 to 6, and r is an integer from 1 to 4;

A is hydrogen, —X—C(O)—OR8, or a radical of

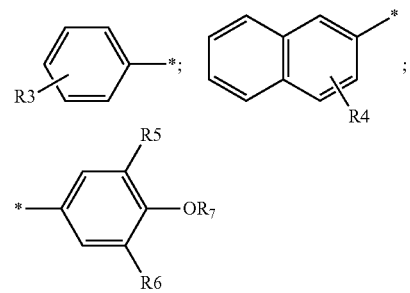

R3 or R4 is H, C1 to C18 alkyl, OH, halogen or C3-C7 cycloalkyl;

R5 or R6 is hydrogen, C1-C4 alkyl, cyclohexyl, or cyclohexyl which is substituted by 1-3 C1-C4 alkyl groups;

R7 is hydrogen, methyl, trimethylsilyl, benzyl, phenyl, sulfonyl or C1-C18 alkyl;

R8 is hydrogen, C1-C10 alkyl or C3-C7 cycloalkyl; and

X is phenylene, C1-C4 alkyl group-substituted phenylene or cyclohexylene.

In other embodiments, the phosphonate stabilizer may comprise a diphosphonate. A disphosphonate will have substantially the same end group as the formula above. In between the alkyl group and the phosphorus element, the formula may further include another phosphorus group and another alkyl group, wherein the alkyl group is positioned in between the two phosphorus groups.

Particular examples of phosphonates that may be used according to the present disclosure include diethyl 1-phenyl ethyl phosphonate, diethyl 2-phenyl ethyl phosphonate, diethyl benzyl phosphonate, or mixtures thereof. Particular phosphonate compounds include, for instance:

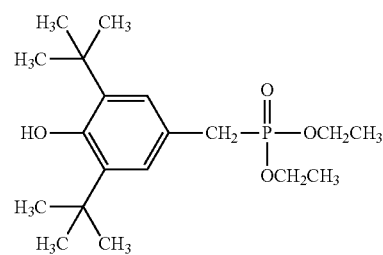

-continued

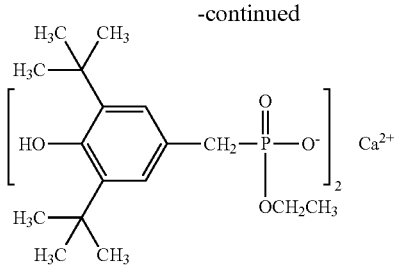

In another embodiment, the phosphate stabilizer has the following formula:

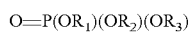

Or

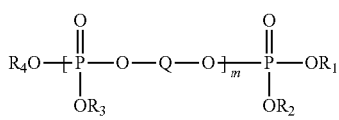

Wherein
$R_1$, $R_2$, $R_3$, and $R_4$ are H, C1-C20 alkyl, unsubstituted or C1-C10 alkyl-substituted phenyl or naphthyl:
m is an integer of 1 to 10;
Q is a radical of

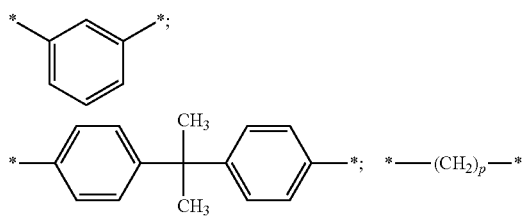

p is an integer of 1 to 4.

Particular examples of phosphates that may be used according to the present disclosure include triphenyl phosphate, tributyl phosphate, tricresyl phosphate. 2-ethylhexyl diphenyl phosphate, cresyl diphenyl phosphate, oligomeric ethyl ethylene phosphate, bisphenol A bis(diphenyl phosphate), resorcinol bis(diphenyl phosphate), or mixtures thereof.

In one embodiment, one or more phosphonate stabilizers are present in the polymer composition while the polymer composition is essentially free of any phosphites or phosphonites. Phosphite has a formula of $P(OR)_3$ and phosphonite has a formula of $P(OR)_2R$, wherein R is C1-C20 alkyl, unsubstituted or C1-C20 alkyl-substituted phenyl or naphthyl group and R can be different in the formula from each other. In one embodiment, for instance, the polymer composition contains phosphites and/or phosphonites in an amount less than about 0.1% by weight.

In accordance with the present disclosure, the polymeric material used to form the molded reflector can have an initial reflectance at 460 nm of greater than about 90%, such as greater than about 93%, such as greater than about 95%. The initial reflectance at 460 nm is generally less than 100%. The polymeric material can also have an initial whiteness index of greater than about 86, such as greater than about 92, such as greater than about 95. The initial whiteness index is generally less than 110, such as less than about 108.

In addition to a PCT resin, a white pigment and at least one phosphonate stabilizer, the polymeric material can also contain various other ingredients and components in various amounts. In one embodiment, for instance, the polymeric material can further contain an inorganic filler. In one particular embodiment, the polymeric material contains from about 20% to about 60% by weight of the PCT polymer, from about 1% to about 40% by weight of the inorganic filler, from about 2% to about 50% by weight of the white pigment and from about 0.01% to about 5% by weight of the one or more phosphonate and/or phosphate stabilizers.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which:

FIG. 1 is a perspective view of one embodiment of an LED assembly made in accordance with the present disclosure;

FIG. 2 is a plan view of the LED assembly illustrated in FIG. 1;

FIG. 3 is a perspective view of another embodiment of an LED assembly made in accordance with the present disclosure; and FIG. 4 is a plan view of the test specimen for the Lap-Shear Test as described in the example below prior to being placed in the tensile machine.

Repeat use of reference characters in the present specification and drawings is intended to represent the same or analogous features or elements of the present invention.

DETAILED DESCRIPTION

It is to be understood by one of ordinary skill in the art that the present discussion is a description of exemplary embodiments only, and is not intended as limiting the broader aspects of the present disclosure.

In general, the present disclosure is directed to a polymer composition and to articles made from the composition that can exhibit various properties that relate to reflectance, whiteness, flow properties during melt processing and/or mechanical properties such as impact strength. The composition of the present disclosure can be used in numerous and different end use applications. For instance, the composition can be used as a reflector for light. For example, the polymer composition may be used to produce a reflector for LED assemblies, may be used as a component in a sign, such as a lighted sign, may be used as a label, or in any other suitable application where high light reflectance properties are desired.

In one embodiment, the present disclosure is generally directed to reflectors for light-emitting devices, such as light-emitting diodes. The present disclosure is also directed to a polymer composition for producing the reflectors and is directed to a light-emitting diode assembly. As will be described in greater detail below, the polymer composition of the present disclosure not only has excellent reflectance properties and is resistant to yellowing, but is also well suited for bonding and adhering to encapsulants, including silicone resins.

The polymer composition of the present disclosure generally contains a polymer resin and an antioxidant stabilizer comprising a phosphonate. Optionally, the composition can also contain one or more reinforcing agents, such as a filler or fibers, a white pigment, and various other light stabilizers. In one embodiment, the polymer composition is substantially free of any phosphites or phosphonites.

More particularly, the polymer composition may contain poly(1,4-cyclohexanedimethanol terephthalate) as the polymer resin combined with a phosphonate and/or phosphate stabilizer. In one embodiment, the stabilizer may comprise an organophosphorus compound that includes at least one phosphorus having a +5 valence state. The phosphonate stabilizer has been found to significantly improve whiteness stability while preserving the ability of the polymer composition to adhere to silicone resins.

The phosphonate and phosphate stabilizer provides the above benefits while being contained in the polymer composition at relatively minor amounts. For instance, the phosphonate or phosphate stabilizer may be present in the polymer composition used to form the reflector in an amount of less than about 8% by weight, such as in an amount of less than about 6% by weight, such as in an amount of less than about 5% by weight, such as even in an amount less than about 3% by weight. For instance, the phosphonate stabilizer may be present in the polymer composition in an amount from about 0.01% to about 3% by weight, such as from about 0.01% to about 2% by weight. The phosphate stabilizer, when present, may be added in greater amounts than when a phosphonate stabilizer is present and may be present in the polymer composition in an amount from about 0.05% to about 6% by weight, such as 0.1% to about 3% by weight.

In one embodiment, the stabilizer may comprise an organophosphorus compound having the following phosphorus group:

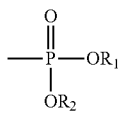

In one embodiment, a phosphonate stabilizer may be used having the following formula:

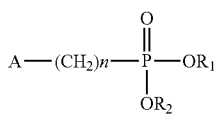

Wherein $R_1$ is H, C1-C20 alkyl, unsubstituted or C1-C4 alkyl-substituted phenyl or naphthyl:

$R_2$ is H, C1-C20 alkyl, unsubstituted or C1-C4 alkyl-substituted phenyl or naphthyl, or $M^{r+}_r$, wherein $M^{r+}$ is an r-valent metal cation or ammonium ion;

n is an integer from 0 to 6, and r is an integer from 1 to 4;

A is hydrogen, —X—C(O)—OR8, or a radical of

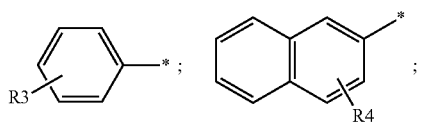

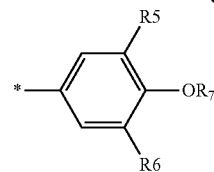

R3 or R4 is H, C1 to C18 alkyl, OH, halogen or C3-C7 cycloalkyl;

R5 or R6 is hydrogen, C1-C4 alkyl, cyclohexyl, or cyclohexyl which is substituted by 1-3 C1-C4 alkyl groups;

R7 is hydrogen, methyl, trimethylsilyl, benzyl, phenyl, sulfonyl or C1-C18 alkyl;

R8 is hydrogen, C1-C10 alkyl or C3-C7 cycloalkyl; and

X is phenylene, C1-C4 alkyl group-substituted phenylene or cyclohexylene.

Particular examples of phosphonates that may be used according to the present disclosure include phenyl phosphonates and benzyl phosphonates, such as diethyl 1-phenyl ethyl phosphonate, diethyl 2-phenyl ethyl phosphonate, diethyl benzyl phosphonate, or mixtures thereof. Particular phosphonate compounds include, for instance:

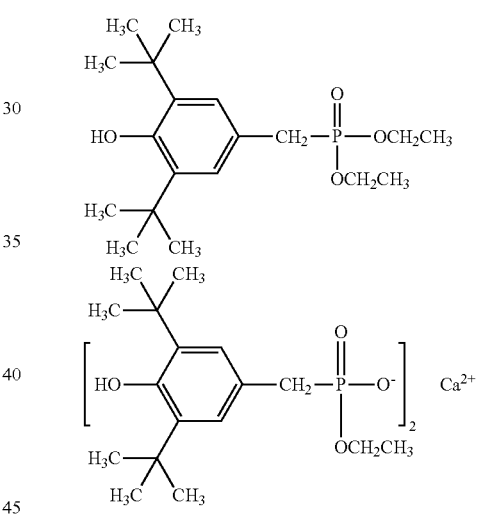

In another embodiment, a phosphate stabilizer is used that has the following formula:

$O=P(OR_1)(OR_2)(OR_3)$

When using a phosphate stabilizer, the phosphate stabilizer may comprise an organophosphorus compound that has the same phosphorus group as described above. In one embodiment, the phosphate stabilizer may have the following formula:

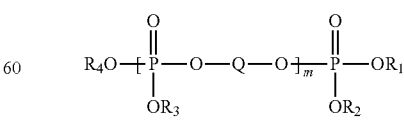

Wherein $R_1$, $R_2$, $R_3$, and $R_4$ are H, C1-C20 alkyl, unsubstituted or C1-C10 alkyl-substituted phenyl or naphthyl;

m is an integer of 1 to 10;

Q is a radical of

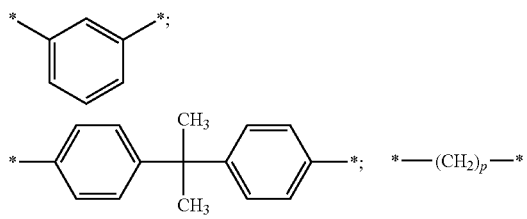

p is an integer of 1 to 4;

Particular examples of phosphates that may be used according to the present disclosure include triphenyl phosphate, tributyl phosphate, tricresyl phosphate, 2-ethylhexyl diphenyl phosphate, cresyl diphenyl phosphate, oligomeric ethyl ethylene phosphate, bisphenol A bis(diphenyl phosphate), resorcinol bis(diphenyl phosphate), or mixtures thereof.

Polymer compositions formulated in accordance with the present disclosure can be injection molded for forming various articles, such as reflectors. Molded articles made in accordance with the present disclosure may be used, for instance, as a reflector in a LED assembly, particularly for LED assemblies that emit white light. The reflector may be in the form of a single piece or may be formed by assembling two or more sub-parts. When the reflector is in the form of a single piece, the reflector can be prepared from the polymer composition only. When formed from two or more sub-parts, on the other hand, one or more of the sub-parts may be metal, ceramic or the like. The polymer composition can be molded over a metal or other polymeric part.

In one embodiment, a reflector is made in accordance with the present disclosure that defines a cavity that is intended to surround a light-emitting diode. The reflector reflects the light emitted by the LED in an outward direction and through a lens. The cavity may have a cylindrical shape, conical shape, parabolic shape, or any other suitable shape. Alternatively, the cavity may have walls that are parallel or substantially parallel to the light-emitting diode. An encapsulant may be formed over the cavity and may comprise an epoxy or silicone material.

The reflector housings of the present disclosure may be used in numerous and diverse applications. As described above, the housings are particularly well suited for use in LED assemblies. Such LED assemblies, for instance, may be incorporated into traffic signal lights, display backlights for computer monitors, televisions and the like, cellular telephone displays, automotive displays, automotive headlamps, flashlights, interior lighting, street lights, exterior lighting, and the like. In addition to being used with LED assemblies, the housings and reflectors of the present disclosure may also be incorporated into other light-emitting devices or in any application where reflective properties are needed.

As described above, molded articles made in accordance with the present disclosure not only exhibit good adhesion properties to resins, such as silicone and epoxy polymers, but also exhibit excellent light reflective and light stable properties. When tested for bond strength to silicone resins, for instance, the polymeric composition may exhibit silicone bond strengths according to the Lap-Shear Test of greater than about 25 lbf, such as greater than about 40 lbf, such as greater than about 50 lbf, such as even greater than about 60 lbf. The Lap-Shear Test is described in greater detail in the examples below.

The polymer composition of the present disclosure can also have a relatively high initial reflectance. For instance, once molded into an article, the polymer material of the present disclosure can have an initial reflectance at 460 nm of greater than about 90%, such as greater than about 93%, such as greater than about 95%. Reflectance is measured according to ASTM Test Method 1331 using a spectracolormeter. During testing, a CIE D65 daylight illuminant is used at an angle of 10°.

In addition to initial reflectance, polymer articles made according to the present disclosure can also have a relatively high initial whiteness index. Whiteness index can be measured according to WI E313. Articles made according to the present disclosure can have an initial whiteness index of greater than about 86, such as greater than about 88, such as greater than about 90, such as greater than about 92.

Referring to FIGS. 1 and 2, one embodiment of an LED assembly 10 that may be made in accordance with the present disclosure is shown. In the embodiment illustrated in FIGS. 1 and 2, the LED assembly 10 is considered a side view LED. As shown, the LED assembly 10 includes a light-emitting diode 12 that is configured to emit light when a current is fed through the device. The light-emitting diode 12, for instance, may be comprised of a semiconductor chip including multiple layers of materials. The LED 12 generally includes an n-type material layer and a p-type material layer, which form a p-n junction that can be connected to a voltage source. In one embodiment, for instance, the p-type layer may comprise doped gallium aluminum arsenide, while the n-type layer may comprise doped gallium arsenide.

The LED 12 is connected to a first bonding wire 14 and to a second bonding wire 16. The bonding wires 14 and 16 are connected to a lead frame 18. The lead frame 18 includes a first lead frame portion 20 and a second lead frame portion 22. The lead frame 18 may include or be connected to an anode 24 and a cathode 26 which may also be considered a first terminal 24 and a second terminal 26.

In accordance with the present disclosure, the LED assembly 10 further includes a reflector 28 which can also serve as the housing for the LED assembly. The reflector 28, in accordance with the present disclosure, is made from a polymer composition having excellent reflectance properties.

As shown in FIGS. 1 and 2, the reflector 28 defines a cavity 30 in which the LED 12 is located. The walls of the cavity 30 generally surround the LED 12 and, in the embodiment illustrated, have a depth sufficient for the LED 12 to be recessed within the cavity.

The cavity 30 of the reflector 28 surrounds the LED 12 and serves to reflect light being emitted by the LED in an outward direction. The cavity 30 may have any suitable shape. For instance, the cavity 30 may be cylindrical, conical, parabolic, or any other suitable curved form. Alternatively, the walls of the cavity 30 may be parallel, substantially parallel, or tapered with respect to the diode 12. In the embodiment illustrated in FIG. 1, for instance, the cavity 30 has a smooth surface and is comprised of side walls 32 and 34 and end walls 36 and 38. The side walls 32 and 34 taper in an outward direction from the LED 12. The end walls 36 and 38, on the other hand, can be substantially parallel or may also taper outwardly from the LED source.

If desired, the cavity 30 of the reflector 28 may be filled with an encapsulant, such as a transparent material or a translucent material. For instance, the cavity 30 may be filled with an epoxy or a silicone material. In one embodiment, the material used to fill the cavity 30 may act as a lens for the light being emitted by the LED 12.

Referring to FIG. 3, another embodiment of an LED assembly 50 that may be made in accordance with the present disclosure is shown. In the embodiment illustrated in FIG. 3, a top view LED assembly is shown. The top view LED assembly 50 is similar in construction to the side view LED assembly 10 illustrated in FIGS. 1 and 2.

For instance, the top view LED assembly 50 includes an LED 52 that is positioned towards the bottom of a cavity 54 of a reflector 56. The LED 52 is also connected to a lead frame 58. In the embodiment illustrated in FIG. 3, the cavity 54 of the reflector 56 is filled with a clear material 60.

LED assemblies as shown in FIGS. 1-3 generally have relatively small dimensions. For example, the LED assemblies typically have a greatest dimension (such as height, width, depth or diameter) that is generally less than about 10 mm, such as typically less than about 8 mm. The LED assemblies typically include at least one dimension, such as depth, that is less than 5 mm, such as less than 2 mm, such as even less than 1 mm. As will be described below, the polymer composition of the present disclosure is capable of forming reflectors for LED assemblies using melt flow processing techniques. For instance, in one embodiment, the polymer composition of the present disclosure is injection or blow molded in forming the reflectors. Of particular advantage, the composition of the present disclosure is formulated so as to have melt flow properties capable of forming hundreds of reflectors simultaneously.

The polymer composition of the present disclosure contains one or more polymer resins in addition to a phosphonate and/or phosphate stabilizer and a white pigment. The polymer resin generally comprises a polyester polymer. In other embodiments, however, the polymer resin may comprise a liquid crystal aromatic polyester polymer, a polycarbonate polymer, or mixtures thereof. Particular polymer resins that may be used include polyethylene terephthalate, polypropylene terephthalate, polybutylene terephthalate, polyethylene naphthalate, polybutylene naphthalate, aliphatic polyesters such as polyester glutarate, and the like.

In general, any suitable thermoplastic polymer may be included in the polymer composition. In one embodiment, thermoplastic polymers having a high melting temperature, such as greater than about 260° C. are used. In addition to the above polymers, other polymers that may be used include high temperature polyamide polymers, such as nylon 66, nylon 3, nylon 4, nylon 5, nylon 46, and the like. Still other polymers that may be used include liquid crystal polyester polymers, polytetrafluoroethylene polymers, fluorinated ethylene polymers, and the like.

In one particular embodiment, the polymer resin comprises a poly(1,4-cyclohexanedimethanol terephthalate) polymer, which is typically referred to as a "PCT" polymer. Poly(1,4-cyclohexanedimethanol terephthalate) is a polyester that contains repeat units from a dicarboxylic acid component and a glycol component. At least about 80 mol percent, more preferably at least about 90 mol percent, and especially preferably all of the diol repeat units are derived from 1,4-cyclohexanedimethanol and are of formula (I).

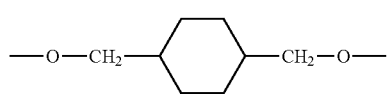

(I)

At least about 80 mol percent, more preferably at least about 90 mol percent, and especially preferably all of the dicarboxylic acid repeat units are derived from terephthalic acid and are of formula (II).

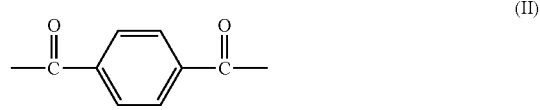

(II)

In one embodiment, the PCT polymer contains 100 mol percent of terephthalic acid or diesters. The glycol component, on the other hand, can contain a total of 100 mol percent 1,4-cyclohexanedimethanol.

In various embodiments, however, the dicarboxylic acid component may contain up to 10 mol percent of other aromatic, aliphatic, or alicyclic dicarboxylic acids such as isophthalic acid, naphthalenedicarboxylic acid, cyclohexanedicarboxylic acid, succinic acid, subacic acid, adipic acid, glutaric acid, azelaic acid, and the like.

The glycol component may also contain up to about 10 mol percent of other aliphatic or alicyclic glycols, such as diethylene glycol, triethylene glycol, ethylene glycol, propanediol, butanediol, pentanediol, hexanediol, and the like.

The PCT polymer can have an inherent viscosity (I.V.) of from about 0.3 to about 1.5 and a melting point of at least 260° C.

In one embodiment, the PCT polymer can comprise a blend of two or more different grades of PCT polymers. For instance, in one embodiment, a blend, such as a 1:1 blend, of high I.V. PCT polymer with a low I.V. PCT polymer may be used. In an alternative embodiment, a blend, such as a 2:1 blend, may be used that includes a PCT polymer wherein the dicarboxylic acid component is 100 mol percent terephthalic acid and a PCT polymer in which the dicarboxylic acid component is 90 mol percent terephthalic acid and 10 mol percent isophthalic acid.

In general, the polymer resin is present in the composition in an amount of at least about 20% by weight, such as in an amount of at least 30% by weight, such as in an amount of at least 40% by weight, such as in an amount of at least about 50% by weight, such as in an amount of at least about 60% by weight. The polymer resin is generally present in an amount less than about 80% by weight, such as in an amount less than about 70% by weight. In one embodiment, a PCT polymer is present in an amount from about 20% by weight to about 60% by weight.

In addition to the PCT polymer, the composition also contains at least one white pigment in amounts greater than 2% by weight, such as in amounts of at least about 10% by weight, such as in amounts of at least about 15% by weight. The white pigment is present in the composition in an amount sufficient to increase the reflectance of articles molded from the composition. White pigments that may be included in the composition include titanium dioxide, zinc oxide, white lead, aluminum oxide, barium sulfate, and the like.

In one embodiment, the white pigment comprises titanium dioxide. The titanium dioxide may be any sort, such as a rutile titanium dioxide. The titanium dioxide particles can have any suitable shape, such as spherical particles or elliptic particles. The titanium dioxide powder can be comprised of particles having a diameter of from about 10 nm to about 20,000 nm, such as from about 150 nm to about 500 nm.

In one embodiment, the titanium dioxide particles can be coated. For example, the titanium dioxide particles can be first coated with an inorganic coating and then optionally with an organic coating that is applied over the inorganic coating. Inorganic coatings that may be used include metal oxides. Organic coatings may include carboxylic acids, polyols, alkanolamines, and/or silicon compounds.

Examples of carboxylic acids suitable for use as an organic coating include adipic acid, terephthalic acid, lauric acid, myristic acid, palmitic acid, stearic acid, polyhydroxystearic acid, oleic acid, salicylic acid, malic acid, and maleic acid. As used herein, the term "carboxylic acid" includes the esters and salts of the carboxylic acids.

Examples of silicon compounds suitable for an organic coating include, but are not limited to, silicates, organic silanes, and organic siloxanes, including organoalkoxysilanes, aminosilanes, epoxysilanes, mercaptosilanes, and polyhydroxysiloxanes. Suitable silanes can have the formula $R_xSi(R')_{4-x}$ wherein R is a nonhydrolyzable aliphatic, cycloaliphatic, or aromatic group having from 1 to about 20 carbon atoms, and R' is one or more hydrolyzable groups such as an alkoxy, halogen, acetoxy, or hydroxy group, and X is 1, 2, or 3.

Useful suitable silanes suitable for an organic coating include one or more of hexyltrimethoxysilane, octyltriethoxysilane, nonyltriethoxysilane, decyltriethoxysilane, dodecyltriethoxysilane, tridecyltriethoxysilane, tetradecyltriethoxysilane, pentadecyltriethoxysilane, hexadecyltriethoxysilane, heptadecyltriethoxysilane, octadecyltriethoxysilane, N-(2-aminoethyl) 3-aminopropylmethyldimethoxysilane, N-(2-aminoethyl) 3-aminopropyltrimethoxysilane, 3-aminopropyltriethoxysilane, 3-glycidoxypropyltrimethoxysilane, 3-glycidoxypropylmethyldimethoxysilane, 3-mercaptopropyltrimethoxysilane and combinations of two or more thereof. In other useful silanes, R has between 8 and 18 carbon atoms and R' is one or more of chloro, methoxy, ethoxy, or hydroxy groups.

In one embodiment, the white pigment may comprise Type II chalk resistance particles as classified according to ASTM Test D476. For example, in one embodiment, the white pigment may comprise titanium dioxide particles that include a surface treatment that produces the chalk resistance properties. For instance, in one embodiment, the titanium dioxide may include a surface treatment containing alumina. The white pigment may have a neutral tint or have a blue tint.

One or more white pigments may be present in the composition in an amount of at least about 10% by weight, such as in an amount of at least about 15% by weight, such as in an amount of at least 20% by weight, such as in an amount of at least 25% by weight. The white pigments may be present in the composition generally in an amount less than 60% by weight, such as in an amount less than about 50% by weight.

The polymer composition of the present disclosure can also optionally contain one or more reinforcing agents, such as fillers and fibers. Such materials can include, for instance, glass fibers, wollastonite, potassium titanate, calcium carbonate, talc, mica, silica, kaolin, and the like. Such inorganic fillers may be present in the composition in an amount from about 1% to about 40% by weight, such as in an amount from about 5% to about 30% by weight.

The composition may further contain one or more reactive stabilizers, such as a reactive viscosity stabilizer. A reactive viscosity stabilizer comprises a material capable of not only reacting with end groups on the polymer resin, such as on a PCT polymer, but also capable of stabilizing the viscosity of the polymer resin in a manner that prevents the viscosity from fluctuating during melt processing. The reactive viscosity stabilizer can also serve to compatibilize the composition.

In one embodiment, the reactive stabilizer comprises a material that can react with carboxyl or hydroxyl end groups on the PCT polymer. In this manner, the reactive stabilizer may act as a chain extender.

Reactive stabilizers that may be used in accordance with the present disclosure generally include phenoxy resins and/or non-aromatic epoxy resins. In one embodiment, for instance, the reactive stabilizer comprises a modified phenoxy resin that is capable of reacting with the PCT polymer. The phenoxy resin, for instance, may include hydroxyl functionality. The phenoxy resin, for instance, may have a glass transition temperature of less than about 120° C., such as less than about 110° C., such as less than about 100° C. The phenoxy resin may have a viscosity when tested in cyclohexanone at 25% NV of less than about 2500 cP, such as less than about 2300 cP.

Non-aromatic epoxy resins that may be used as the reactive stabilizer include 3,4-epoxycyclohexenylmethyl-3',4'-epoxycyclohexene carboxylate, 1,4-cyclohexane dimethanol-digrycicdyl ether, hydrogenated bis-phenol-A type epoxy resin and/or tris(2,3-epoxypropyl) isocyanurate. In general, any suitable alicyclic epoxy resin may be used.

In addition to the above reactive stabilizers or instead of the above reactive stabilizers, the composition may contain an epoxy-functional copolymer as the reactive stabilizer. Exemplary copolymers having multiple epoxy pendant groups include the reaction products of one or more ethylenically unsaturated monomers (e.g. styrene, ethylene, and the like) with an epoxy-containing ethylenically unsaturated monomer (e.g. glycidyl C1-4 (alkyl)acrylate, ally glycidyl ethacrylate, and glycidyl itoconate). For example, in one embodiment the epoxy-functional copolymer is a styrene-acrylic copolymer (including an oligomer) containing glycidyl groups incorporated as side chains.

As described above, the reactive stabilizer incorporated into the composition may comprise any material that can react with carboxyl or hydroxyl end groups on the thermoplastic polymer without causing yellowing, especially after thermal aging. In one embodiment, the reactive stabilizer may comprise an anhydride. Examples may include pyromellitic dianhydride, trimellitic anhydride, 3-(triethoxysilyl) propylsuccinic anhydride, and the like. Other reactive additives can include various oxazolines and/or silanes. Such reactive additives can include phenylenebisoxazoline and 3-aminopropyltriethoxysilane.

In general, the reactive stabilizers are present in the composition in an amount from about 0.2% to about 8% by weight, such as from about 0.5% to about 5% by weight.

The polymer composition of the present disclosure can further contain one or more impact modifiers. The impact modifiers can be reactive with the polymer resin or non-reactive. In one embodiment, for instance, the composition contains at least one reactive impact modifier and at least one non-reactive impact modifier.

Reactive impact modifiers that may be used include ethylene-maleic anhydride copolymers, ethylene-alkyl(meth)acrylate-maleic anhydride copolymers, ethylene-alkyl(meth)acrylate-glycidyl(meth)acrylate copolymers, and the like. In one embodiment, for instance, a reactive impact modifier is used that comprises a random terpolymer of ethylene, methylacrylate, and glycidyl methacrylate. The terpolymer can have a glycidyl methacrylate content of from about 5% to about 20%, such as from about 6% to about 10%. The terpolymer may have a methylacrylate content of from about 20% to about 30%, such as about 24%.

In general, a reactive impact modifier may be present in the composition in an amount from about 0.05% to about 10% by weight, such as in an amount from about 0.1% to about 5% by weight.

Non-reactive impact modifiers that may be blended into the polymer composition of the present disclosure generally include various rubber materials, such as acrylic rubbers, ASA rubbers, diene rubbers, organosiloxane rubbers, EPDM rubbers, SBS or SEBS rubbers, ABS rubbers, NBS rubbers, and the like. In one embodiment, an ethylene acrylic rubber is present such as an ethylene acrylic ester copolymer. Particular examples of non-reactive impact modifiers include ethylene butylacrylate, ethylene(methyl)acrylate, or 2 ethyl hexyl acrylate copolymers. In one particular embodiment, an ethylene(methyl)acrylate copolymer is present in the composition that contains(methyl)acrylate in an amount of from about 20% to about 30% by weight, such as in an amount of about 24% by weight.

In one particular embodiment, the composition of the present disclosure includes a combination of an ethylene (methyl)acrylate copolymer combined with a terpolymer of ethylene, methylacrylate and glycidyl methacrylate.

When present in the composition, non-reactive impact modifiers can be included in amounts of from about 0.05% to about 15% by weight, such as in an amount from about 0.1% to about 8% by weight.

Another additive that may be present in the polymer composition is a polytetrafluoroethylene polymer. Inclusion of a polytetrafluoroethylene polymer may enhance the reflectance and the whiteness index of articles made from the polymer composition. The polytetrafluoroethylene polymer may be added to the composition in the form of a fine powder having an average particle size of less than about 50 microns, such as less than about 10 microns. In one embodiment, for instance, the polytetrafluoroethylene powder may have an average particle size of from about 1 micron to about 8 microns. The polytetrafluoroethylene polymer may be present in the composition in an amount from about 0.05% to about 10% by weight, such as from about 0.1% to about 6% by weight.

In one embodiment, the polymer composition can also include a lubricant. The lubricant may comprise, for instance, a polyethylene wax, an amide wax, a montanic ester wax, a polyol ester, or the like. A lubricant, in certain embodiments, for instance, may comprise a polyethylene glycol-dilaurate and/or a neopentyl glycol dibenzoate. In one particular embodiment, the lubricant may comprise an oxidized polyethylene wax. The polyethylene wax may have a density of from about 0.94 g/cm$^3$ to about 0.96 g/cm$^3$. When present, the lubricant may be included in the composition in an amount from about 0.05% to about 6% by weight, such as from about 0.1% to about 4% by weight.

In addition to the above, the polymer composition may contain various other additives and ingredients. For instance, the composition may contain various thermal and oxidative stabilizers, ultraviolet light stabilizers, brighteners, and the like. Other additives that may be included in the polymer composition include mold release agents, nucleating agents, crystallization aids, plasticizers, and the like.

In one embodiment, the polymer composition may contain a sterically hindered amine light stabilizer and/or a hindered phenol. Light stabilizers may be present in the composition in an amount from about 0.02% to about 3% by weight, such as in an amount from about 0.05% to about 1% by weight. In one particular embodiment, a hindered amine light stabilizer may be used in conjunction with a hindered phenolic antioxidant.

In order to produce articles in accordance with the present disclosure, the polymer composition, in one embodiment, can comprise a melt-mixed blend, wherein all of the polymeric components are well-dispersed within each other and all of the non-polymeric ingredients are well-dispersed in and bound by the polymer matrix, such that the blend forms a unified whole.

Any melt-mixing method may be used to combine the polymeric components and non-polymeric ingredients. For example, in one embodiment, the polymeric components and the non-polymeric components may be added to a melt mixer, such as for example a single or twin-screw extruder, a blender, a kneader, or a Banbury mixer, either all at once through a single step addition, or in a stepwise fashion and then melt-mixed. When combining the different additives together, the polymeric components are typically first blended and melt-mixed. Subsequently, the non-polymeric additives are then blended with the mix.

The polymer composition can be formulated so as to have a desired melt viscosity. For instance, the polymer composition may have a melt viscosity at a shear rate of 1000/sec and at 305° C. of less than about 250 Pa·s, such as less than about 225 Pa·s, such as less than about 200 Pa·s. The melt viscosity is generally greater than about 30 Pa·s, such as greater than about 40 Pa·s, such as greater than about 50 Pa·s.

The blended composition can be molded into any desired shape through any suitable molding process. For instance, in one embodiment, articles are formed through injection molding. During injection molding, the temperature of the composition may be from about 280° C. to about 35° C. The temperature of the molds, on the other hand, may be in a range of from about 50° C. to about 150° C.

LED assemblies made in accordance with the present disclosure can be used in numerous and different applications. For instance, the LED assemblies can be used in traffic signal lights, LCD displays, backlights, cellular telephones, automotive display lights, automotive headlamps, flashlights, interior lighting, streetlights, and in exterior lighting applications.

In addition to being used in LED assemblies, the polymer composition of the present disclosure can also be used to make various other articles. For instance, the polymer composition can be used to produce any article where good light reflectance properties are desired. For instance, molded articles made according to the present disclosure can be used in signs and labels in order to improve the visual appearance of the item. In one embodiment, for instance, a molded article made in accordance with the present disclosure may be used in a lighted sign, such as an exit sign.

Other applications of the polymer composition include use as a roofing material or used as a component in a solar cell. The polymer composition may also be used to produce trim pieces and bezels for consumer products, such as consumer appliances. In other embodiments, the polymer composition may be used to mold interior trim pieces for vehicles, such as automobiles.

The present disclosure may be better understood with reference to the following examples.

EXAMPLES

The following examples are presented below by way of illustration and not by way of limitation. All parts are by weight.

Table 1 below lists various compositions that were prepared by melt compounding the components shown in the table using a 32 mm twin-extruder operating at about 300° C., using a screw speed of about 300 rpm and a melt temperature of from about 320° C. to about 330° C. Upon exiting the extruder, the compositions were cooled and pelletized.

The compositions were molded into ISO tensile bars according to ISO method 527-1/2 using a mold temperature of about 120° C.

SYLGARD 577A/B (in a 10:1 ratio). The above silicone resin is a silicone elastomer. Once the silicone resin is applied to the tensile bar, the part is cured at 180° C. for 15 minutes in an oven and then removed from the oven and cooled to room temperature. The silicone layer is peeled by hand to check for

TABLE 1

Compositions of Examples

| Components | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| PCT polymer | 48.3 | 48.5 | 48.5 | 50 | 50 | 48.3 | 50 | 49.2 | 55 | 53.7 | 49 |
| Chopped glass fibers | 18 | 18 | 18 | 18 | 18 | 18 | 18 | 18 | 16 | 20 | 18 |
| TiO2 rutile pigment | 20 | 20 | 20 | 20 | 20 | 20 | 20 | 20 | 18 | 20 | 20 |
| Phosphate stabilizer | | | | 0.3 | | | | | | | |
| Tetra(2,4-di-tert-butylphenyl)biphenyl-4,4'-diyl-diphosphonite | | | | | 0.3 | | | | | | |
| Pentaerythiritoltetrastearate | 0.6 | 0.6 | 0.6 | 0.6 | 0.6 | 0.6 | 0.6 | 0.9 | 0.9 | 0.5 | 0.4 |
| Phosphonate Stabilizer | | | | | | 0.3 | 0.1 | 0.6 | 0.3 | | 0.3 |
| Phosphate Stabilizer | | | | | | | | | | 2 | 1 |
| Oxidized poly ethylene wax | 0.5 | 0.5 | 0.5 | 0.35 | 0.35 | 0.5 | 0.5 | 0.5 | 0.5 | 0.5 | 0.5 |
| Pentaerythiritoltetrakis(3-(3,5di-tert-butyl-4-dyroxyphenyl)propionate) | 0.2 | 0.25 | 0.3 | 0.2 | 0.2 | 0.2 | 0.2 | 0.2 | 0.2 | 0.2 | 0.2 |
| Bis (2,4-di-t-butylphenyl) Pentraerythritol Diphosphite | 0.3 | 0.05 | | | | | | | | | |
| 2,5-thiophene diylbis(5-tert-butyl-1,3-benzoxazole) | 0.1 | 0.1 | 0.1 | 0.05 | 0.05 | 0.1 | 0.1 | 0.1 | 0.1 | 0.1 | 0.1 |
| Ethylene, methyl acrylate, glycidyl methacrylate terpolymer | 1 | 1 | 1 | 0.5 | 0.5 | 1 | 0.5 | 0.5 | | | 0.5 |
| Phenoxy resin | 1 | 1 | 1 | 1 | 1 | 1 | 1 | 1 | 1 | 1 | 1 |
| Ethyl-methylacrylate copolymer | 4 | 4 | 4 | 3 | 3 | 4 | 3 | 3 | | | 3 |
| Magnesium silicate hydrate; talc nucleant | 2 | 2 | 2 | 2 | 2 | 2 | 2 | 2 | | 2 | 2 |
| Polybutylene terephthalate | 4 | 4 | 4 | 4 | 4 | 4 | 4 | 4 | 6 | | 4 |
| Total (weight %) | 100 | 100 | 100 | 100 | 100 | 100 | 100 | 100 | 100 | 100 | 100 |

In the examples, the phosphonate stabilizer used was calcium bis[monoethyl(3,5-di-tert-butyl-4-hydroxylbenzyl) phosphonate]. The phosphate stabilizer used was triphenyl phosphate.

Table 2 below depicts the properties of the compositions shown in Table 1. Tensile properties were determined using the test method above. Charpy impact strengths and Notched Charpy impact strengths were determined following ISO Test 179.

The reflectance at 460 nm was determined for each composition using the ASTM E1331 method and using CIE D65 daylight illuminant at 10 degrees by spectracolormeterData-Color 600. Measurements were done on tensile bars. Higher reflectance number indicates less absorption or loss of light. A complete reflectance is 100%.

Whiteness Index (WI) was determined using the same reflectance scan based on WI E313. WI of each composition was also measured on tensile bars heat aged at 200° C. for 4 hours. Higher WI numbers indicate better whiteness.

Silicone adhesion was tested according to a peel test and according to a Lap-Shear Test. According to the peel test, a silicone resin is mixed and cast as a layer on the tensile bars described above. The silicone resin used is Dow Corning adhesion. If the silicone layer peels easily, the test is a failure. If the silicone cannot be peeled off by hand, however, the adhesion to silicone passes.

The second silicone adhesion test method is a Lap-Shear Test. The PCT composition is molded into ISO tensile bars. The bar is then cut into half sections. The two pieces of half sections are placed on a 2" copper strip with a silicone adhesive layer adhering the copper strip to the test pieces. The silicone adhesive used is a LED encapsulate silicone, which is Dow Corning OE 6630A/B silicone resin. The two parts of the silicone resin are mixed in a 1:4 ratio. The half bars and copper strip are cured at 150° C. for 2 hours, and then allowed to cool down. The bonded tensile bars are tested by a tensile machine to obtain the peak load for breaking the bond at speed of 1 inch/min at room temperature (23° C.). In particular, each half section of the tensile bar is placed in the jaws of the tensile machine. The peak load is recorded when one of the half sections releases from the copper strip. FIG. 4 illustrates the two half sections attached to the copper strip by the silicone resin.

TABLE 2

Properties of Examples

| Properties | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| Tensile Modulus (Mpa) | 6381 | 6232 | 6244 | 6380 | 6372 | 6506 | 6290 | 6161 | 6310 | 8277 | 6170 |

TABLE 2-continued

Properties of Examples

| Properties | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| Elongation at Break (%) | 2.1 | 2.1 | 2 | 1.9 | 1.8 | 2 | 2 | 2 | 1.2 | 1.4 | 1.7 |
| Charpy Impact (KJ/m$^2$) | 33 | 36 | 32 | 31 | 30 | 34 | 32 | 36 | 15 | 24 | 30 |
| Initial Reflectance at 460 nm (%) | 99.7 | 99.7 | 99.7 | 94.4 | 93.8 | 100 | 99.6 | 100 | 99.8 | 99.8 | 99.5 |
| Whiteness Index before aging | 107 | 105 | 105 | 91 | 89 | 107 | 104 | 105 | 107 | 106 | 106 |
| Whiteness Index after aging at 200° C. for 4 hr | 89 | 72 | 52 | 63 | 61 | 90 | 85 | 92 | 90 | 90 | 94 |
| Whiteness Index retention after 200° C. for 4 hr | 83.2% | 68.6% | 49.5% | 69.2% | 68.5% | 84.1% | 81.7% | 87.6% | 84.1% | 84.9% | 88.7% |
| Silicone Adhesion (Sylgard 577)-peeling | Failed | Failed | Passed | Failed | Failed | Passed | Passed | Passed | Passed | Passed | Passed |
| Silicone Adhesion (OE 6630)-lap shear peak load (lbf) | 0 | 10 | 64 | 0 | 0 | 66 | 65 | 66 | 62 | 63 | 65 |

As shown above, compositions made with the phosphonate and phosphate stabilizer displayed improved reflectance stability and silicone adhesion.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed:

1. A composition for producing molded parts comprising:
    from about 20% to about 60% by weight of a poly(1,4-cyclohexanedimethanol terephthalate);
    from about 0.01% to about 3% by weight of a stabilizer, the antioxidant stabilizer comprising an organophosphorus compound having a phosphorus group as follows:

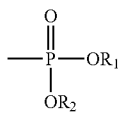

Wherein
R$_1$ is H, C1-C20 alkyl, unsubstituted or C1-C4 alkyl-substituted phenyl or naphthyl;
R$_2$ is H, C1-C20 alkyl, unsubstituted or C1-C4 alkyl-substituted phenyl or naphthyl, or M$^{r+}_r$, wherein M$^{r+}$ is an r-valent metal cation or ammonium ion; and
    wherein the composition has an initial reflectance at 460 nm of greater than about 90% and has an initial whiteness index of greater than about 86.

2. A composition as defined in claim 1, wherein the organophosphorus compound comprises a phosphate or a phosphonate.

3. A composition as defined in claim 1, wherein the organophosphorus compound has the following formula:

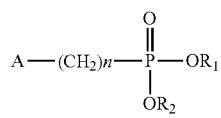

Wherein
R$_1$ is H, C1-C20 alkyl, unsubstituted or C1-C4 alkyl-substituted phenyl or naphthyl;
R$_2$ is H, C1-C20 alkyl, unsubstituted or C1-C4 alkyl-substituted phenyl or naphthyl, or M$^{r+}_r$, wherein M$^{r+}$ is an r-valent metal cation or ammonium ion;
n is an integer from 0 to 6, and r is an integer from 1 to 4;
A is hydrogen, —X—C(O)—OR8, or a radical of

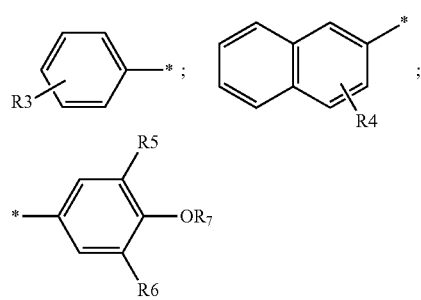

R3 or R4 is H, C1 to C18 alkyl, OH, halogen or C3-C7 cycloalkyl;
R5 or R6 is hydrogen, C1-C4 alkyl, cyclohexyl, or cyclohexyl which is substituted by 1-3 C1-C4 alkyl groups;
R7 is hydrogen, methyl, trimethylsilyl, benzyl, phenyl, sulfonyl or C1-C18 alkyl;
R8 is hydrogen, C1-C10 alkyl or C3-C7 cycloalkyl; and
X is phenylene, C1-C4 alkyl group-substituted phenylene or cyclohexylene; and wherein the composition is free of phosphite compounds or phosphonite compounds or contains phosphite compounds or phosphonite compounds in an amount less than 0.1% by weight.

4. A composition as defined in claim 1, wherein the organophosphorus compound comprises:

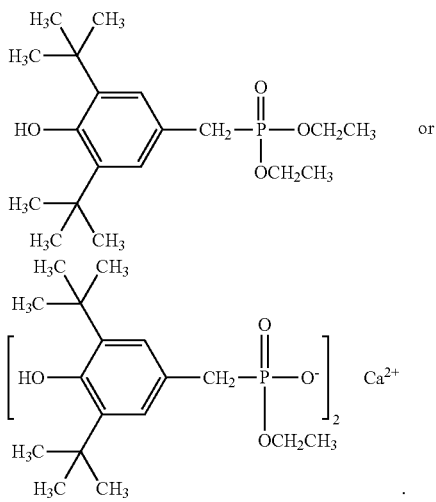 or

5. A composition as defined in claim 1, wherein the organophosphorus compound comprises diethyl 1-phenyl ethyl phosphonate, diethyl 2-phenyl ethyl phosphonate, diethyl benzyl phosphonate, or mixtures thereof.

6. A composition as defined in claim 1, wherein the organophosphorus compound comprises triphenyl phosphate, tributyl phosphate, tricresyl phosphate, 2-ethylhexyl diphenyl phosphate, cresyl diphenyl phosphate, oligomeric ethyl ethylene phosphate, bisphenol A bis(diphenyl phosphate), resorcinol bis(diphenyl phosphate), or mixtures thereof.

7. A composition as defined in claim further comprising a white pigment.

8. A molded reflector, the reflector being molded from a polymeric material, the polymeric material being comprised of a poly(1,4-cyclohexanedimethanol terephthalate), and a stabilizer, the stabilizer comprising an organophosphorus compound having at least one phosphorus with a +5 valence state, the organophosphorus compound being present in the polymeric material in an amount from about 0.01% to about 5% by weight; and
wherein the composition has an initial reflectance at 460 nm of greater than about 90% and has an initial whiteness index of greater than about 86.

9. A molded reflector as defined in claim 8, wherein the organophosphorus compound includes a phosphorus group as follows:

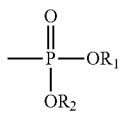

Wherein
R₁ is H, C1-C20 alkyl, unsubstituted or C1-C4 alkyl-substituted phenyl or naphthyl; and
R₂ is H, C1-C20 alkyl, unsubstituted or C1-C4 alkyl-substituted phenyl or naphthyl, or $M^{r+}{}_r$, wherein $M^{r+}$ is an r-valent metal cation or ammonium ion.

10. A molded reflector as defined in claim 8, wherein the organophosphorus compound comprises:

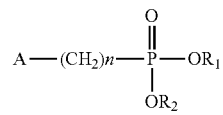

Wherein
R₁ is H, C1-C20 alkyl, unsubstituted or C1-C4 alkyl-substituted phenyl or naphthyl;
R₂ is H, C1-C20 alkyl, unsubstituted or C1-C4 alkyl-substituted phenyl or naphthyl, or $M^{r+}{}_r$, wherein $M^{r+}$ is an r-valent metal cation or ammonium ion;
n is an integer from 0 to 6, and r is an integer from 1 to 4;
A is hydrogen, —X—C(O)—OR8, or a radical of

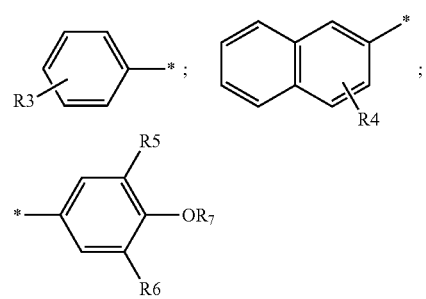

R3 or R4 is H, C1 to C18 alkyl, OH, halogen or C3-C7 cycloalkyl;
R5 or R8 is hydrogen, C1-C4 alkyl, cyclohexyl, or cyclohexyl which is substituted by 1-3 C1-C4 alkyl groups;
R7 is hydrogen, methyl, trimethylsilyl, benzyl, phenyl, sulfonyl or C1-C18 alkyl;
R8 is hydrogen, C1-C10 alkyl or C3-C7 cycloalkyl; and
X is phenylene, C1-C4 alkyl group-substituted phenylene or cyclohexylene.

11. A molded reflector as defined in claim 8, wherein the organophosphorus compound comprises:

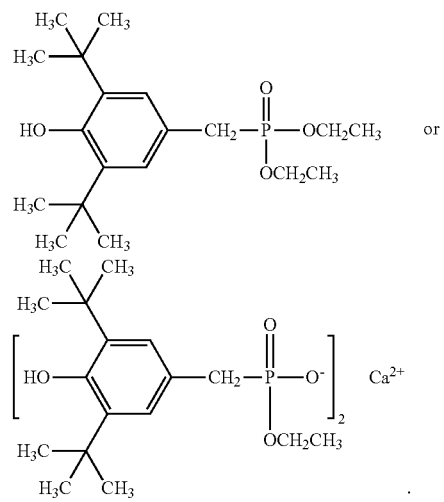

12. A molded reflector as defined in claim 8, wherein the organophosphorus compound comprises:

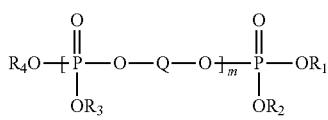

Wherein $R_1$, $R_2$, $R_3$, and $R_4$ are H, C1-C20 alkyl, unsubstituted or C1-C10 alkyl-substituted phenyl or naphthyl;

m is an integer of 1 to 10;

Q is a radical of

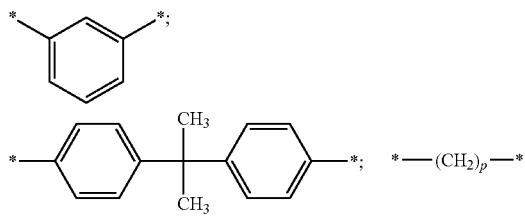

p is an integer of 1 to 4.

13. A molded reflector as defined in claim 8, wherein the polymeric material has a silicone bond strength according to the Lap-Shear Test of greater than about 25 lbf.

14. A molded reflector as defined in claim 8, wherein the polymeric material further contains a white pigment, the white pigment being present in an amount of at least about 10% by weight.

15. A molded reflector as defined in claim 8, wherein the polymeric material contains from about 20% to about 60% of the poly(1,4-cyclohexanedimethanol terephthalate), from about 1 to about 40% by weight of the inorganic filler, from about 2% to about 50% by weight of a white pigment, and from about 0.02% to about 3% by weight of the stabilizer.

16. A molded reflector as defined in claim 8, wherein the polymeric material further contains a hindered amine stabilizer, a hindered phenol, or mixtures thereof.

17. A molded reflector as defined in claim 8, wherein the polymeric material is free of any phosphite compounds or phosphonite compounds or contains phosphite compounds or phosphonite compounds in an amount less than 0.1% by weight.

18. A molded reflector as defined in claim 8, wherein the organophosphorus compound comprises a phosphonate, or a phosphate.

19. A molded reflector as defined in claim 18, wherein the phosphonate comprises diethyl 1-phenyl ethyl phosphonate, diethyl 2-phenyl ethyl phosphonate, diethyl benzyl phosphonate, or mixtures thereof.

20. A molded reflector as defined in claim 18, wherein the organophosphorus compound comprises a phosphate and wherein the phosphate comprises triphenyl phosphate, tributyl phosphate, tricresyl phosphate, 2-ethylhexyl diphenyl phosphate, cresyl diphenyl phosphate, oligomeric ethyl ethylene phosphate, bisphenol A bis(diphenyl phosphate), resorcinol bis(diphenyl phosphate), or mixtures thereof.

21. A light-emitting device comprising the molded reflector as defined in claim 8, the molded reflector having a top, a bottom, and at least one side wall extending from the top to the bottom, the top defining a reflective cavity that extends from a top surface towards the bottom, the reflective cavity surrounding a light-emitting diode, the light-emitting diode including an anode connected to a first lead frame member and a cathode connected to a second lead frame member, the cavity containing a silicone composition.

* * * * *